US012211798B1

United States Patent
Liu

(10) Patent No.: US 12,211,798 B1
(45) Date of Patent: *Jan. 28, 2025

(54) SUBSTRATE-FREE SEMICONDUCTOR DEVICE ASSEMBLIES WITH MULTIPLE SEMICONDUCTOR DEVICES AND METHODS FOR MAKING THE SAME

(71) Applicant: Micron Technology, Inc., Boise, ID (US)

(72) Inventor: Hung Wen Liu, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/218,589

(22) Filed: Jul. 6, 2023

Related U.S. Application Data

(63) Continuation of application No. 16/896,000, filed on Jun. 8, 2020, now Pat. No. 11,710,702.

(51) Int. Cl.
*H01L 23/538* (2006.01)
*H01L 21/768* (2006.01)
*H01L 23/29* (2006.01)

(52) U.S. Cl.
CPC ........ *H01L 23/5386* (2013.01); *H01L 21/768* (2013.01); *H01L 23/29* (2013.01)

(58) Field of Classification Search
CPC . H01L 21/4853; H01L 21/563; H01L 21/561; H01L 21/6835; H01L 23/5389; H01L 23/5386; H01L 23/49816; H01L 23/3128; H01L 23/3142; H01L 23/5384; H01L 24/05; H01L 24/16; H01L 24/32; H01L 24/33; H01L 24/73; H01L 25/50; H01L 25/0657; H01L 2221/68345
USPC ........................................................ 257/734
See application file for complete search history.

(56) References Cited

U.S. PATENT DOCUMENTS

| | | | |
|---|---|---|---|
| 10,056,351 B2 | 8/2018 | Yu et al. | |
| 10,636,773 B2 * | 4/2020 | Kuo | ...... H01L 25/105 |
| 11,710,702 B2 * | 7/2023 | Liu | ...... H01L 21/561 |
| | | | 257/668 |
| 2016/0099213 A1 | 4/2016 | Tae et al. | |
| 2017/0084589 A1 | 3/2017 | Kuo et al. | |
| 2021/0384134 A1 | 12/2021 | Liu | |

* cited by examiner

*Primary Examiner* — Jasmine J Clark
(74) *Attorney, Agent, or Firm* — Perkins Coie LLP

(57) ABSTRACT

A semiconductor device assembly includes a first remote distribution layer (RDL), the first RDL comprising a lower outermost planar surface of the semiconductor device assembly; a first semiconductor die directly coupled to an upper surface of the first RDL by a first plurality of interconnects; a second RDL, the second RDL comprising an upper outermost planar surface of the semiconductor device assembly opposite the lower outermost planar surface; a second semiconductor die directly coupled to a lower surface of the second RDL by a second plurality of interconnects; an encapsulant material disposed between the first RDL and the second RDL and at least partially encapsulating the first and second semiconductor dies; and a third plurality of interconnects extending fully between and directly coupling the upper surface of the first RDL and the lower surface of the second RDL.

18 Claims, 10 Drawing Sheets

SUBSTRATE-FREE SEMICONDUCTOR DEVICE ASSEMBLIES WITH MULTIPLE SEMICONDUCTOR DEVICES AND METHODS FOR MAKING THE SAME

CROSS-REFERENCE TO RELATED APPLICATION(S)

This application is a continuation of U.S. application Ser. No. 16/896,000 filed Jun. 8, 2020, now U.S. Pat. No. 11,710,702, which is incorporated herein by reference in its entirety.

TECHNICAL FIELD

The present disclosure generally relates to semiconductor device assemblies, and more particularly relates to substrate-free semiconductor device assemblies with multiple semiconductor devices and methods for making the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

Figure 1:
FIGS. 1-12 are simplified schematic cross-sectional views illustrating a series of fabrication steps of a semiconductor device assembly in accordance with an embodiment of the present technology.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

One approach to packaging semiconductor devices into an assembly includes electrically coupling a semiconductor device to an interposer or other pre-formed substrate that is configured to mate with the bond pads of external devices. A significant drawback to pre-formed substrates, however, is their thickness, which contributes significantly to the height (e.g., in the z-dimension) of the semiconductor packages that employ them. Other approaches to packaging semiconductor devices can instead include forming a redistribution layer (RDL) directly on a die (e.g., in a wafer level fan-out process (FOP)). The RDL can includes traces, lines and/or vias that connect the bond pads of a semiconductor device with RDL bond pads, which can in turn be configured to mate with the bond pads of external devices. In one such packaging approach, many semiconductor devices are mounted on a carrier (e.g., at the wafer or panel level) and encapsulated before the carrier is removed. Then an RDL can be formed directly on a front side (e.g., active surface) of the semiconductor devices using various well-known deposition and lithography techniques. Finally, an array of leads, ball-pads, or other types of electrical interconnects are mounted on bond pads of the RDL and the encapsulated semiconductor devices are singulated to form individual device assemblies.

One drawback with the foregoing packaging technique is that it makes it difficult and costly to include multiple semiconductor dies in a single package. Accordingly, various embodiments of the present disclosure address this limitation by providing semiconductor device assemblies with upper and lower RDLs, each configured to couple with a respective die (or die stack), with the dies of each of the upper and lower RDL being arranged back-to-back, and the RDLs electrically connected by interconnects laterally spaced apart from the semiconductor devices.

FIGS. 1 through 12 are simplified schematic cross-sectional views illustrating a series of fabrication steps of a semiconductor device assembly in accordance with an embodiment of the present technology. Beginning with FIG. 1, a temporary carrier wafer 101 is provided with a layer of removeable adhesive 102. Temporary carrier wafer 101 may comprise glass, alumina, silicon, or any other substrate material readily known to those skilled in the art, of a thickness sufficient to provide stability during subsequent processing steps (e.g., at least 0.3 mm, between about 0.4 mm and 3.0 mm, or even thicker). Removeable adhesive 102 can be configured to permit the removal of semiconductor device assemblies formed on the temporary carrier wafer 101 at a subsequent step (illustrated in greater detail with respect to FIG. 12, below). The layer of removeable adhesive 102 may comprise spin-coated thermoplastic materials, thermoset materials, or the like.

Figure 2:
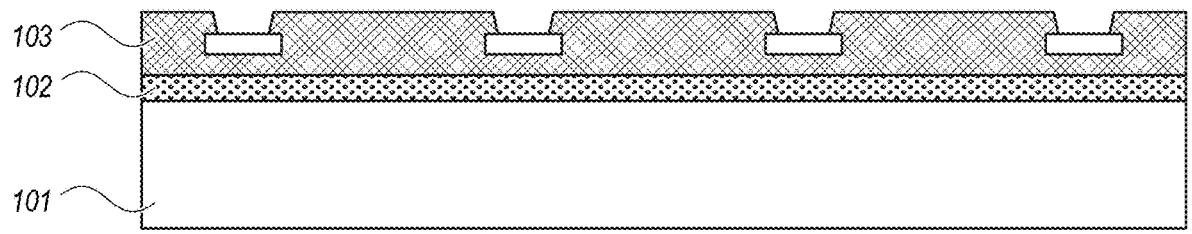
Figure 3:
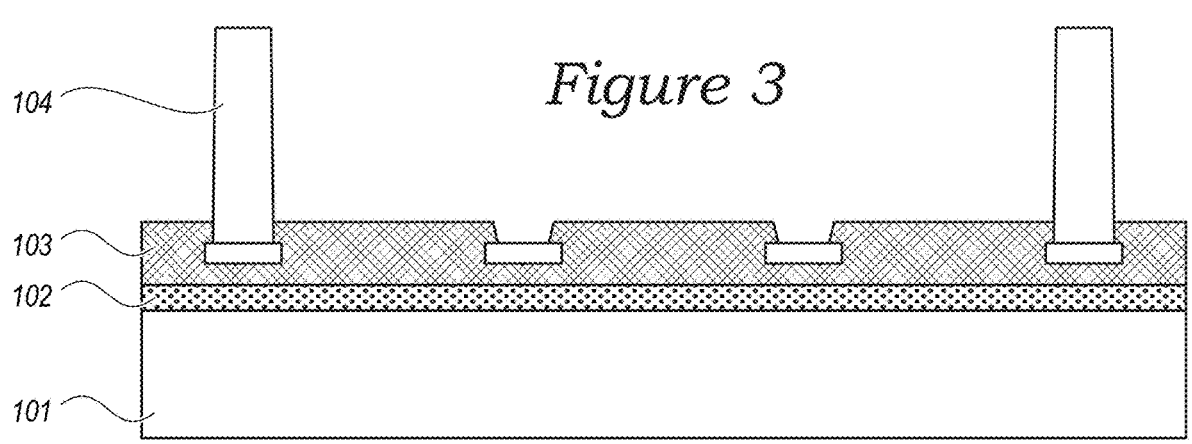

Turning to FIG. 2, a first remote distribution layer (RDL) 103 is formed over the removeable adhesive 102. The first RDL 103 includes a plurality of dielectric layers and a plurality of electrical connection features (e.g., traces, vias, etc.) disposed between and electrically connecting a plurality of outer contact pads (e.g., located closer to an outer edge of the first RDL 103) and a plurality of inner contact pads (e.g., located closer to an inner region of the first RDL 103) to route electrical signals and/or voltages between corresponding ones of the inner contact pads and the outer contact pads. In FIG. 3, tall interconnects 104 (e.g., copper pillars or other free-standing electrical interconnects of sufficient height) are provided on the outer contact pads to permit the routing of electrical signals and/or voltages between the first RDL 103 and subsequently-formed structures, as will be illustrated in greater detail below with reference to FIG. 9.

Figure 4:
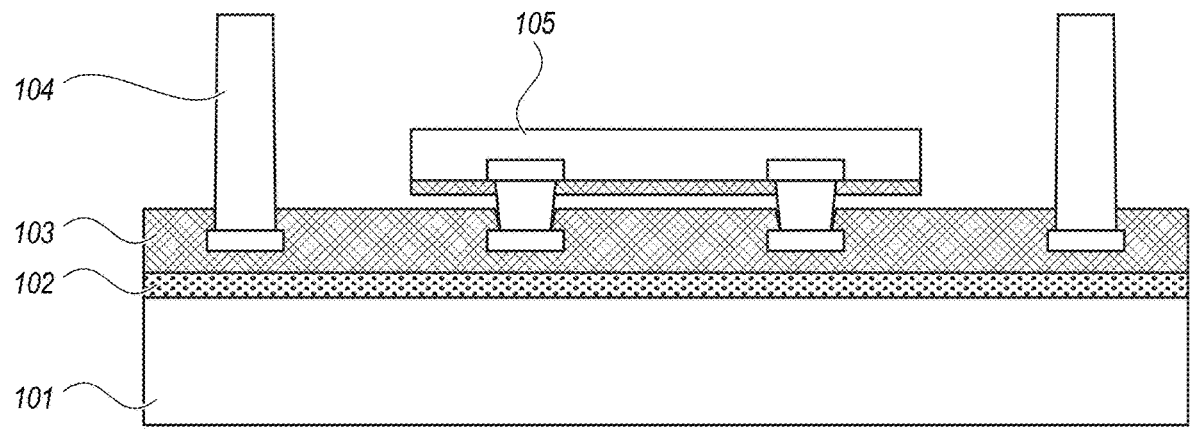
Figure 5:
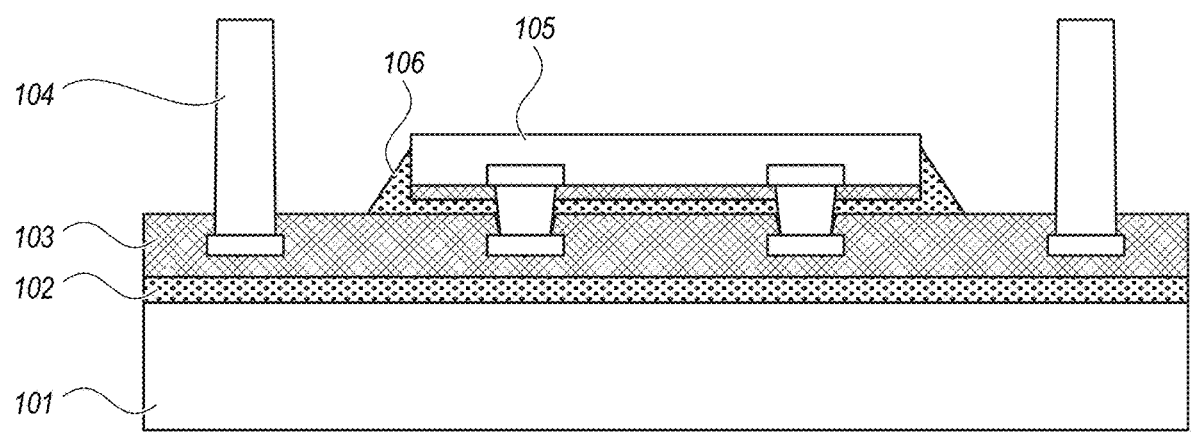

Turning to FIG. 4, a first semiconductor device 105 (e.g., a semiconductor die) is disposed over and electrically connected to the first RDL 103. In the illustrated example of FIG. 4, first semiconductor device 105 is electrically connected to the inner contact pads of the first RDL 103 by a first plurality of interconnects (e.g., copper bumps or pillars, solder balls, or the like), such that each contact pad of the first semiconductor device 105 is electrically connected to a corresponding one of the inner contact pads of the first RDL 103. In FIG. 5, an underfill material (e.g., capillary underfill) 106 is dispensed between the first semiconductor die 105 and the first redistribution layer 103. It should be noted at this point that the order of steps illustrated in FIGS. 3 through 5 is not required, and the disposition of first semiconductor die 105 (and/or the disposition of underfill material 106) can precede the formation of tall interconnects 104 in some embodiments. Moreover, the underfill material 106 may be omitted if a subsequently-disposed encapsulant material (illustrated in greater detail with respect to FIG. 7, below) has sufficiently low viscosity and/or sufficiently high capillary action to flow between the first semiconductor die 105 and the first RDL 103.

Figure 6:
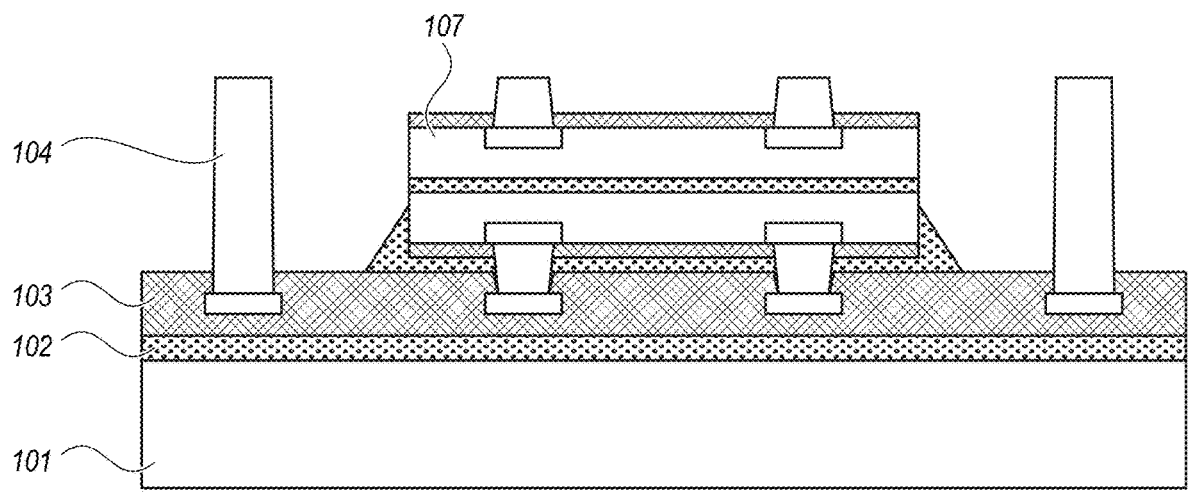

As is illustrated in FIG. 6, a second semiconductor device 107 is subsequently disposed in a back-to-back arrangement (e.g., in which the active surface of the second semiconductor device 107 faces in an opposite direction to the active surface of the first semiconductor device 105) over the first semiconductor device 105. According to one aspect of the present disclosure, the second semiconductor device 107 may be adhered to the first semiconductor device by a layer of adhesive (e.g., a die attach film or the like). The second semiconductor device 107 may be provided with a plurality of interconnects (e.g., copper pillars or bumps) extending upwardly from corresponding contact pads of the second semiconductor device 107 proud of the active surface thereof (e.g., to permit a subsequent planarization step to be performed without adversely affecting the active surface thereof, as is illustrated in greater detail with respect to FIG. 8, below). As can be seen with reference to FIG. 6, the tall interconnects 104 have sufficient height to extend above an active surface of the second semiconductor die 107 (e.g., a height greater than a combined height of the first semiconductor die 105, the second semiconductor die 107, and the layer of adhesive therebetween).

Figure 7:
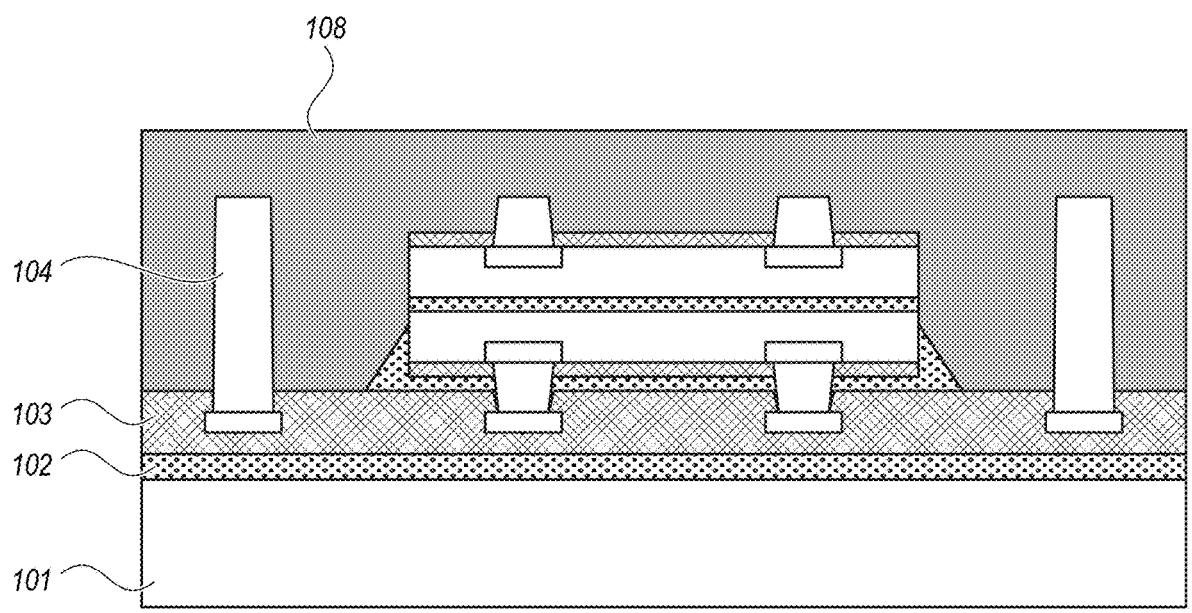

Turning to FIG. 7, an encapsulant material 108 is provided to at least partially encapsulate the first RDL 103, the first semiconductor die 105, the second semiconductor die 107 (including the interconnects disposed thereon) and the tall interconnects 104. The encapsulant material can be a molding compound comprising resin, a thermoplastic, a thermoset plastic, or the like. An upper surface of the encapsulant material 108 can be provided above the uppermost surfaces of the tall interconnects 104 and the interconnects of the second semiconductor device 107, to permit a subsequent planarization step.

Figure 8:
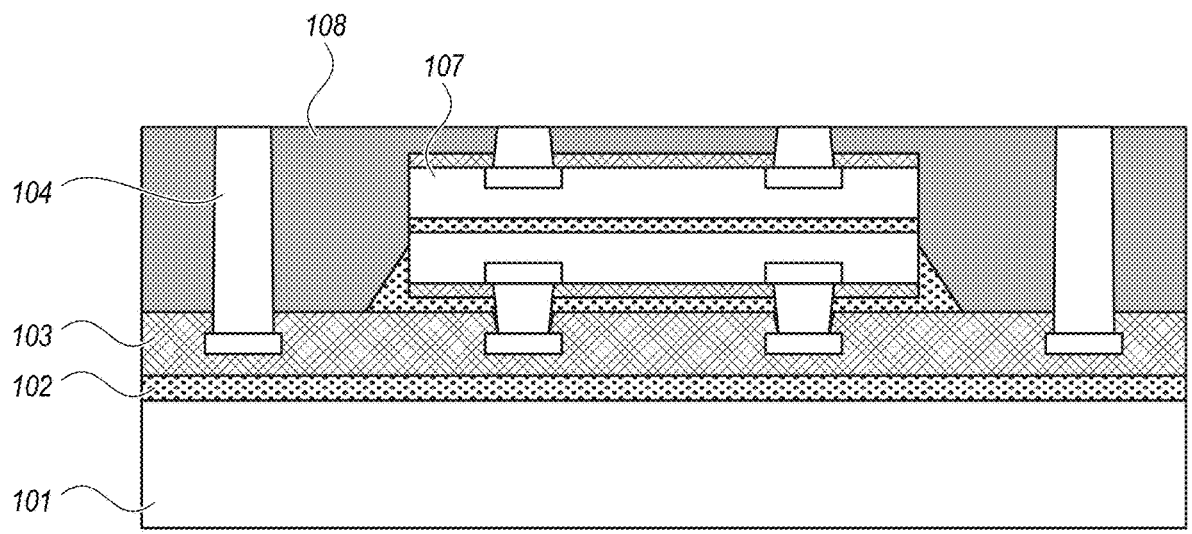
Figure 9:
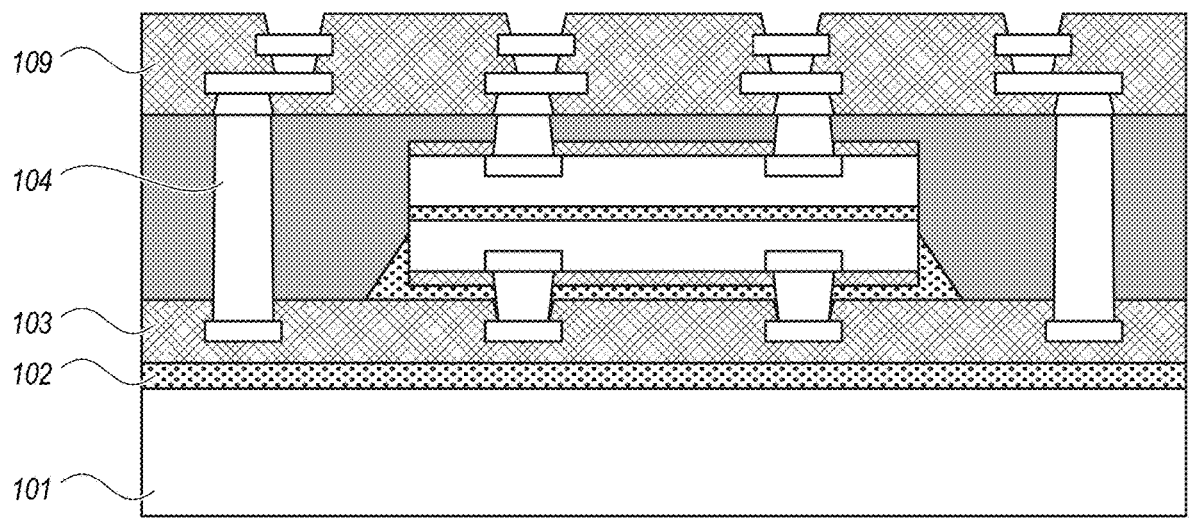

As is illustrated in FIG. 8, the upper surface of the encapsulant material 108 can be planarized (e.g., by chemical-mechanical polishing or other similar grinding operation) to expose and make co-planar the upper surfaces of the tall interconnects 104 and the interconnects of the second semiconductor die 107. Turning to FIG. 9, a second RDL 109 is formed over the upper surface of the encapsulant material 108 and the exposed upper surfaces of the tall interconnects 104 and the interconnects of the second semiconductor die 107. The second RDL 109 includes a plurality of dielectric layers and a plurality of electrical connection features (e.g., traces, vias, etc.) disposed between and electrically connecting a plurality of upper contact pads (e.g., located closer to an outermost upper surface of the second RDL 109 and providing external electrical communication from the assembly) and a plurality of lower contact pads (e.g., located closer to a lower surface of the second RDL 109) to route electrical signals and/or voltages between corresponding ones of the upper contact pads and the lower contact pads. As can be seen with reference to FIG. 9, some of the upper contact pads are accordingly in electrical contact with the lower contact pads that are directly coupled to the second semiconductor device 107, and others of the upper contact pads are in electrical contact with the lower contact pads that are indirectly coupled to the first semiconductor device 105 (e.g., through the tall interconnects 104 and the first RDL 103). Although in the present example embodiment, the upper contact pads are illustrated as recessed in openings of the upper surface of the second RDL 109, in other embodiments, the upper contact pads may be flush, or may stand proud of the upper surface of the second RDL 109.

Figure 10:
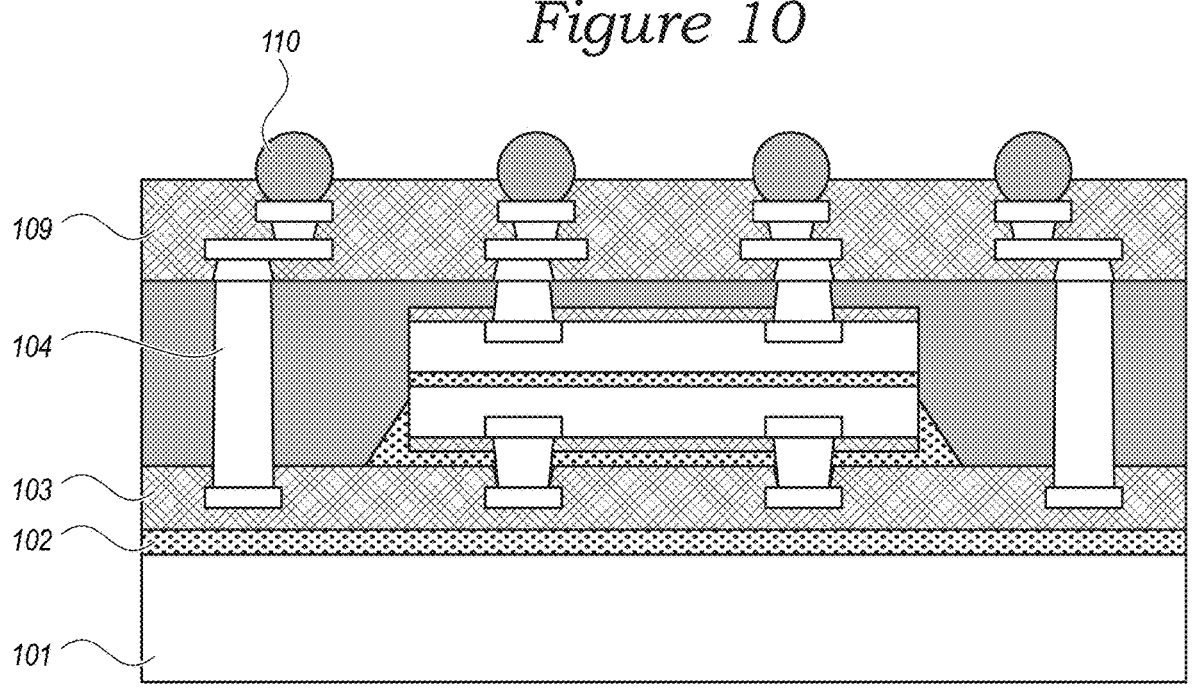
Figure 11:
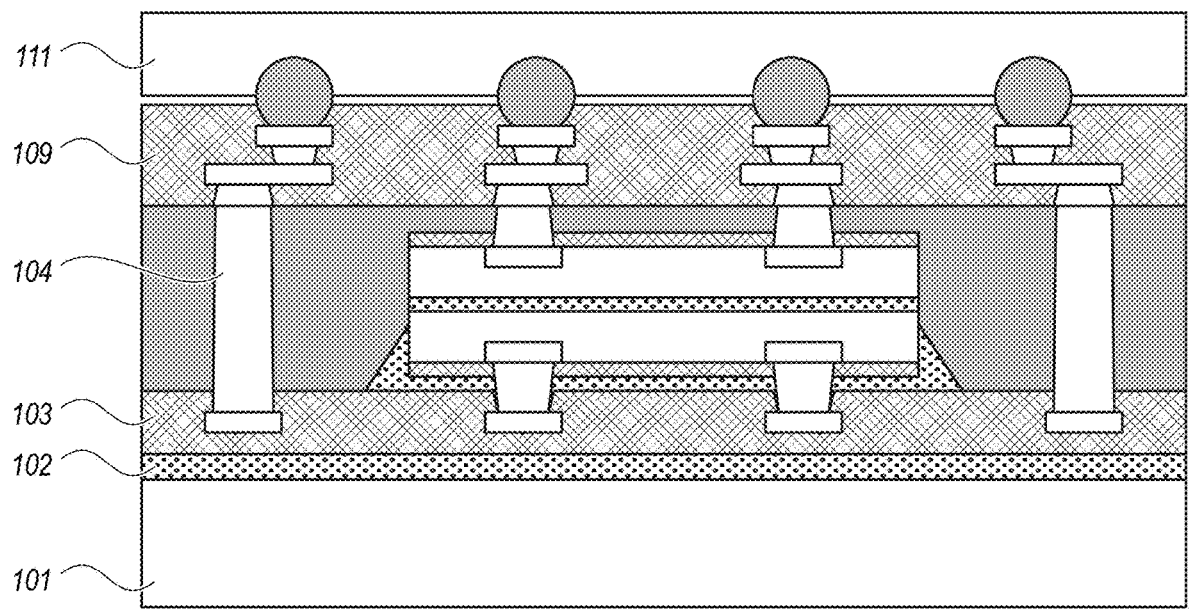
Figure 12:
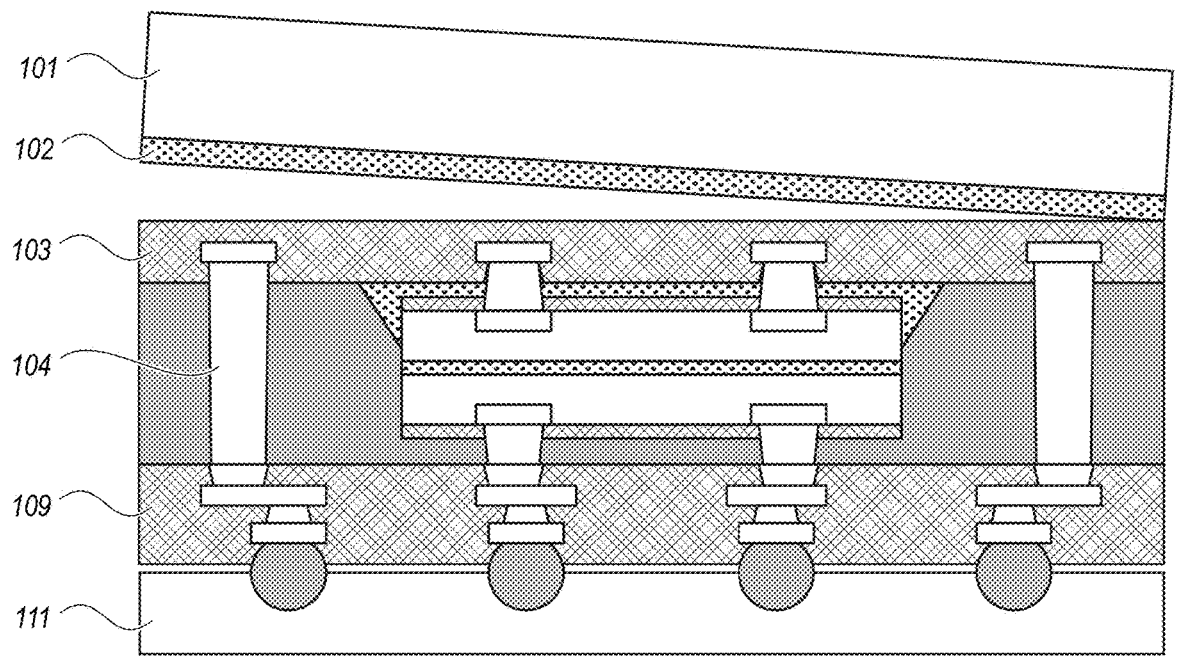

Turning to FIG. 10, a plurality of interconnects 110 (e.g., solder balls, copper bumps, etc.) are formed over the upper contact pads of the second RDL 109 (e.g., via a ball-drop operation, a plating operation, etc.). With the formation of the assembly largely complete (excepting, e.g., a singulation step in which a wafer, panel, or strip comprising a plurality of such assemblies are separated), a temporary carrier structure 111 (e.g., another carrier wafer with temporary adhesive, a tape film, etc.) is attached to the upper surface of the assembly as is illustrated in FIG. 11. The temporary carrier structure 111 is provided to secure the assembly during the removal of the temporary carrier wafer 101 by removing or debonding the removeable adhesive 102, as is illustrated in FIG. 12. The temporary carrier structure 111 may be a sacrificial structure which is, together with the reconstituted wafer of assemblies, singulated to provide discrete assemblies after the removal of the temporary carrier wafer 101 (which can be preserved for re-use). Alternatively, the temporary carrier wafer 101 may be a sacrificial structure which is singulated or damaged during the singulation of assemblies.

Figure 13:
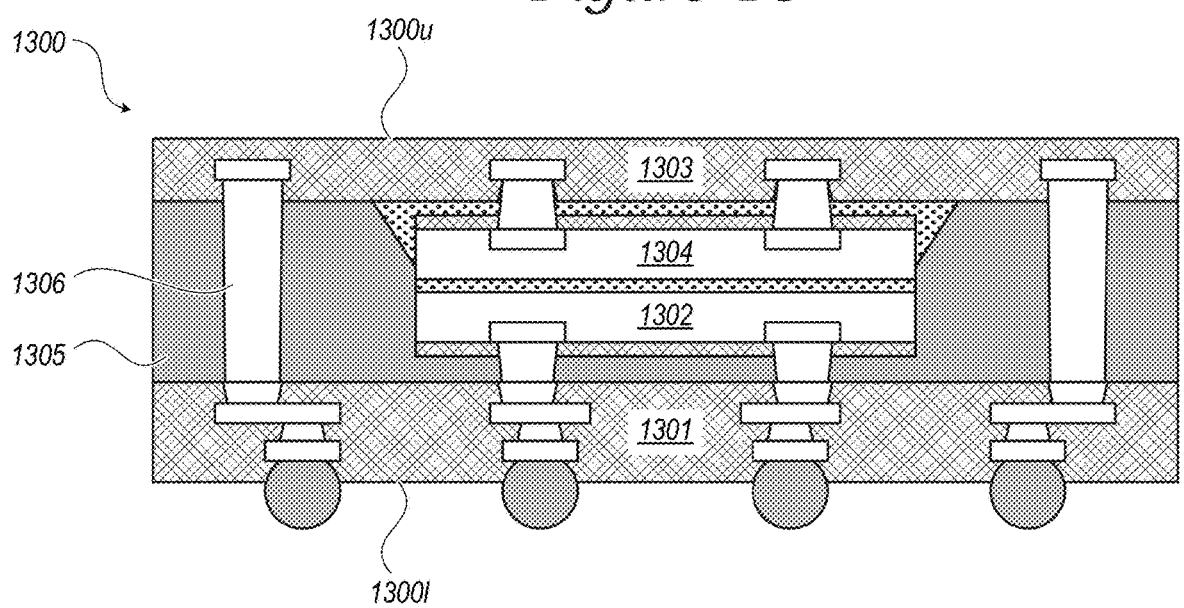
FIGS. 13-16 are simplified schematic cross-sectional views of various semiconductor device assemblies in accordance with embodiments of the present technology.

FIG. 13 illustrates a simplified schematic cross-sectional view of a semiconductor device assembly 1300 in accordance with an embodiment of the present technology following the removal of the temporary carrier structure 111. As can be seen with reference to FIG. 13, assembly 1300 includes a first RDL 1301 having a lower outermost planar surface 1300l of the semiconductor device assembly 1300, a first semiconductor die 1302 directly coupled to an upper surface of the first RDL 1301 by a first plurality of interconnects, a second RDL 1303 having an upper outermost planar surface 1300u of the semiconductor device assembly 1300 opposite the lower outermost planar surface 1300l, a second semiconductor die 1304 directly coupled to a lower surface of the second RDL 1303 by a second plurality of interconnects, an encapsulant material 1305 disposed between the first RDL 1301 and the second RDL 1303 and at least partially encapsulating the first semiconductor die 1302 and the second semiconductor die 1304, and a third plurality of interconnects 1306 extending fully between and directly coupling the upper surface of the first RDL 1301 and the lower surface of the second RDL 1303.

In accordance with one aspect of the present disclosure, the first and second semiconductor dies 1302 and 1304 can be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or any combination thereof. In this regard, the first and second semiconductor dies 1302 and 1304 can be memory dies of a same kind (e.g., both NAND, both DRAM, etc.) or memory dies of different kinds (e.g., one DRAM and one NAND, etc.). In accordance with another aspect of the present disclosure, the first and second semiconductor dies 1302 and 1304 can be logic dies (e.g., controller dies, processor dies, etc.), or a mix of logic and memory dies (e.g., a memory controller die and a memory die controlled thereby).

Figure 14:
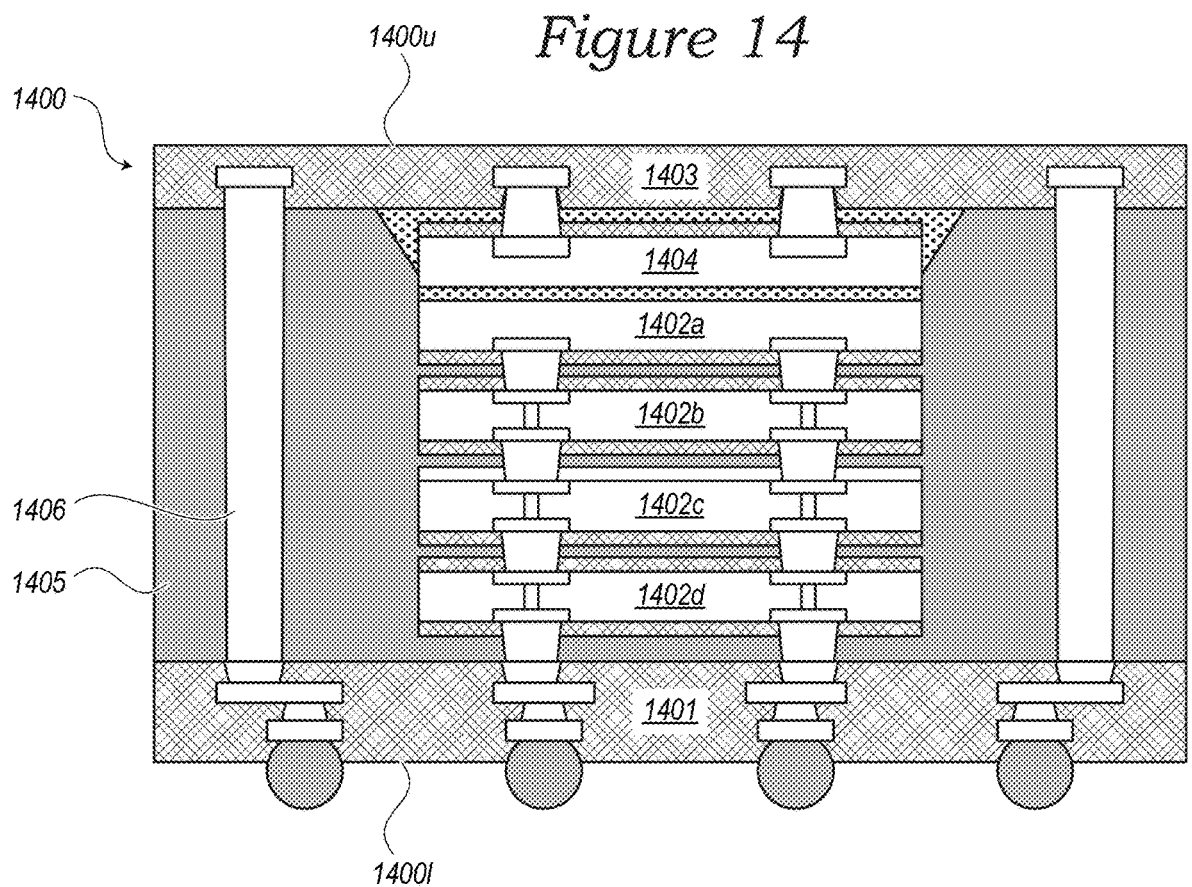

Although in the foregoing example embodiment semiconductor device assemblies have been illustrated and described as including two semiconductor devices, in other embodiments assemblies can be provided with additional semiconductor devices. For example, one or both of the first and second semiconductor devices illustrated in FIG. 13 can be replaced with, e.g., a vertical stack of semiconductor devices connected to a corresponding one of the first and second RDLs by through-silicon vias, wire bonds, or the like. For example, FIG. 14 illustrates a simplified schematic cross-sectional view of a semiconductor device assembly 1400 in accordance with an embodiment of the present technology. As can be seen with reference to FIG. 14, assembly 1400 includes a first RDL 1401 having a lower outermost planar surface 14001 of the semiconductor device assembly 1400 and a stack of first semiconductor dies 1402*a*-1402*d*, the lowermost of which 1402*d* being directly coupled to an upper surface of the first RDL 1401 by a first plurality of interconnects. Although illustrated with four dies in the present example embodiment, in other embodiments a similar stack could include any number of dies desired (e.g., 2, 3, 5, 6, 7, 8, 16, 32, etc.). The assembly further comprises a second RDL 1403 having an upper outermost planar surface 1400*u* of the semiconductor device assembly 1400 opposite the lower outermost planar surface 14001, a second semiconductor die 1404 directly coupled to a lower surface of the second RDL 1403 by a second plurality of interconnects, an encapsulant material 1405 disposed between the first RDL 1401 and the second RDL 1403 and at least partially encapsulating the stack of first semiconductor dies 1402*a*-1402*d* and the second semiconductor die 1404, and a third plurality of interconnects 1406 extending fully between and directly coupling the upper surface of the first RDL 1401 and the lower surface of the second RDL 1403. Such an assembly can be fabricated in a similar fashion to the assembly 1300 illustrated in FIG. 13, by, e.g., disposing a stack of semiconductor dies coupled together with TSVs in lieu of the second semiconductor die 107 illustrated in FIG. 6, with appropriately lengthened tall interconnects 1406 formed analogously to the interconnects 104 illustrated in FIG. 3.

Figure 15:
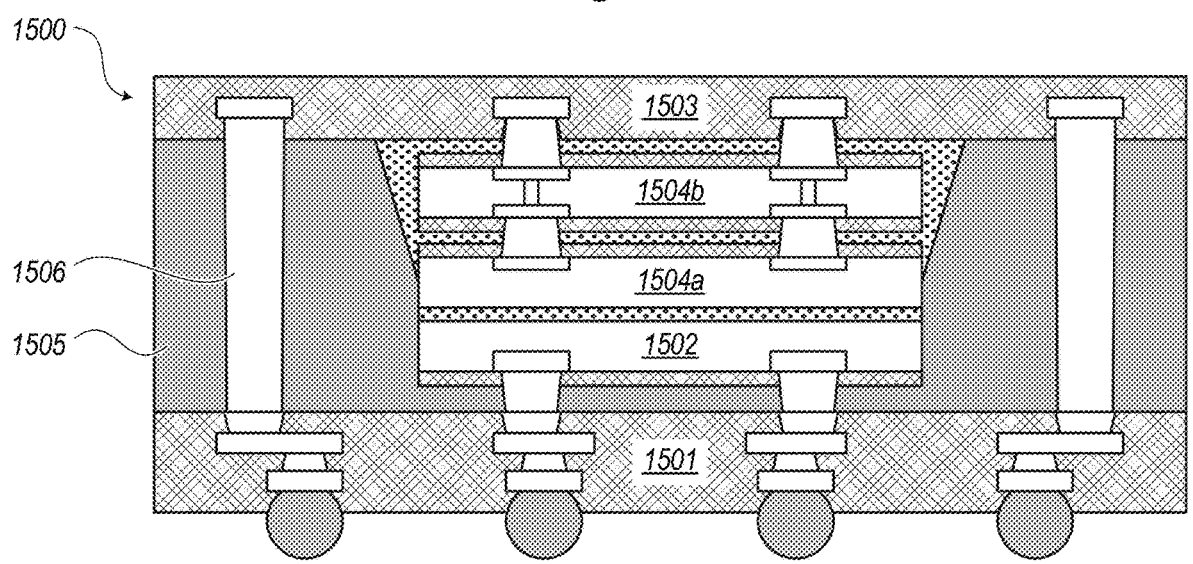

In another embodiment, rather than replacing the second semiconductor device 107 illustrated in FIG. 6 with a stack of dies, the first semiconductor device 105 in FIG. 4 could similarly be replaced with a stack of dies. FIG. 15 illustrates a simplified schematic cross-sectional view of one such semiconductor device assembly 1500 in accordance with an embodiment of the present technology. As can be seen with reference to FIG. 15, assembly 1500 includes a first RDL 1501 having a lower outermost planar surface 15001 of the semiconductor device assembly 1500 and a first semiconductor die 1502 directly coupled to an upper surface of the first RDL 1501 by a first plurality of interconnects. The assembly further comprises a second RDL 1503 having an upper outermost planar surface 1500*u* of the semiconductor device assembly 1500 opposite the lower outermost planar surface 15001 and a stack of second semiconductor dies 1504*a* & 1504*b*, the uppermost of which 1504*b* is directly coupled to a lower surface of the second RDL 1503 by a second plurality of interconnects. The assembly further comprises an encapsulant material 1505 disposed between the first RDL 1501 and the second RDL 1503 and at least partially encapsulating the first semiconductor die 1502 and the stack of second semiconductor dies 1504*a* & 1504*b*. The assembly further comprises a third plurality of interconnects 1506 extending fully between and directly coupling the upper surface of the first RDL 1501 and the lower surface of the second RDL 1503. Such an assembly can be fabricated in a similar fashion to the assembly 1300 illustrated in FIG. 13, by, e.g., disposing a stack of semiconductor dies coupled together with TSVs in lieu of the first semiconductor die 105 illustrated in FIG. 3, with appropriately lengthened tall interconnects 1506 formed analogously to the interconnects 104 illustrated in FIG. 3.

Figure 16:
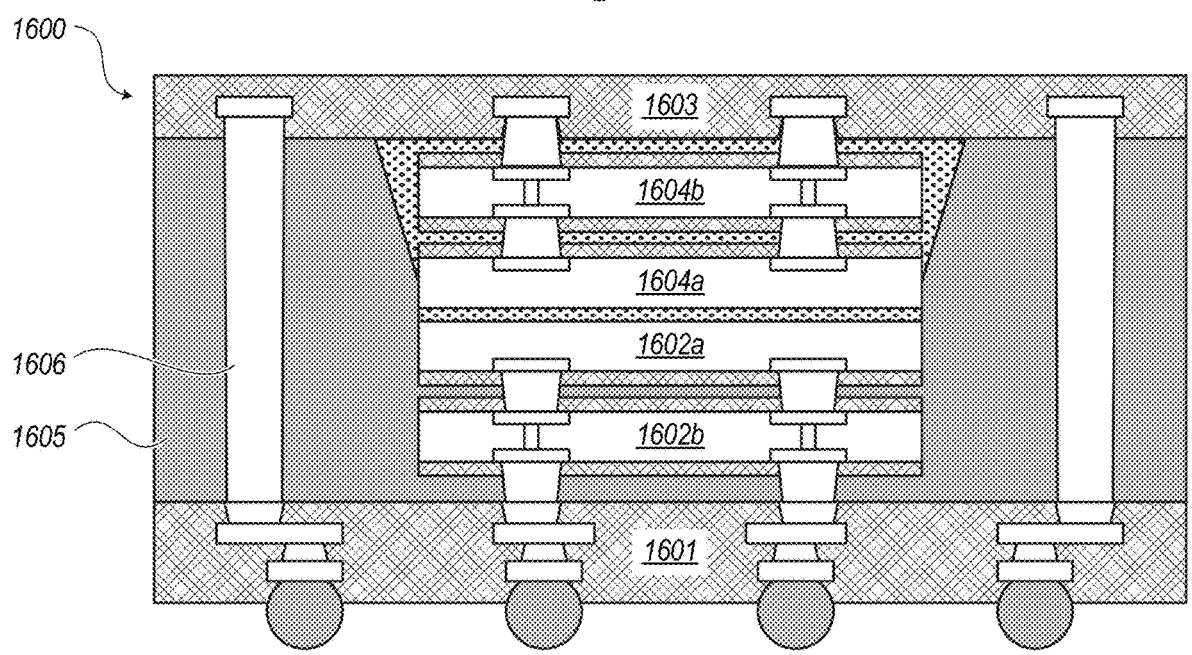

In yet another embodiment, each of the first semiconductor device 105 in FIG. 4 and the second semiconductor device 107 illustrated in FIG. 6 can be replaced with a stack of dies, to provide an assembly having two die stacks arranged back-to-back. FIG. 16 illustrates a simplified schematic cross-sectional view of one such semiconductor device assembly 1600 in accordance with an embodiment of the present technology. As can be seen with reference to FIG. 16, assembly 1600 includes a first RDL 1601 having a lower outermost planar surface 16001 of the semiconductor device assembly 1600 and a first stack of semiconductor dies 1602*a* & 1602*b*, the lowermost of which 1602*b* is directly coupled to an upper surface of the first RDL 1601 by a first plurality of interconnects. The assembly further comprises a second RDL 1603 having an upper outermost planar surface 1600*u* of the semiconductor device assembly 1600 opposite the lower outermost planar surface 16001 and a stack of second semiconductor dies 1604*a* & 1604*b*, the uppermost of which 1604*b* is directly coupled to a lower surface of the second RDL 1603 by a second plurality of interconnects. The assembly further comprises an encapsulant material 1605 disposed between the first RDL 1601 and the second RDL 1603 and at least partially encapsulating the stack of first semiconductor dies 1602*a* & 1602*b* and the stack of second semiconductor dies 1604*a* & 1604*b*. The assembly further comprises a third plurality of interconnects 1606 extending fully between and directly coupling the upper surface of the first RDL 1601 and the lower surface of the second RDL 1603. Such an assembly can be fabricated in a similar fashion to the assembly 1300 illustrated in FIG. 13, by, e.g., disposing a stack of semiconductor dies coupled together with TSVs in lieu of the first semiconductor die 105 illustrated in FIG. 3, and disposing a stack of semiconductor dies coupled together with TSVs in lieu of the second semiconductor die 107 illustrated in FIG. 6, with appropriately lengthened tall interconnects 1606 formed analogously to the interconnects 104 illustrated in FIG. 3.

Although in the foregoing example embodiments, assemblies have been shown with a single die or a single stack of dies connected to each of the first and second RDLs, in other embodiments multiples dies and/or multiple stacks of dies can be arranged (e.g., side-by-side) on one or both of the first and second RDLs. Such an assembly can be fabricated in a similar fashion to the assembly 1300 illustrated in FIG. 13, by, e.g., disposing multiple semiconductor dies or die stacks side-by-side in lieu of the first semiconductor die 105 illustrated in FIG. 3, and/or disposing multiple semiconductor dies or die stacks side-by-side in lieu of the second semiconductor die 107 illustrated in FIG. 6, with appropriate changes to the layout of contact pads and traces in the first and/or second RDLS, mutatis mutandis.

Figure 17:
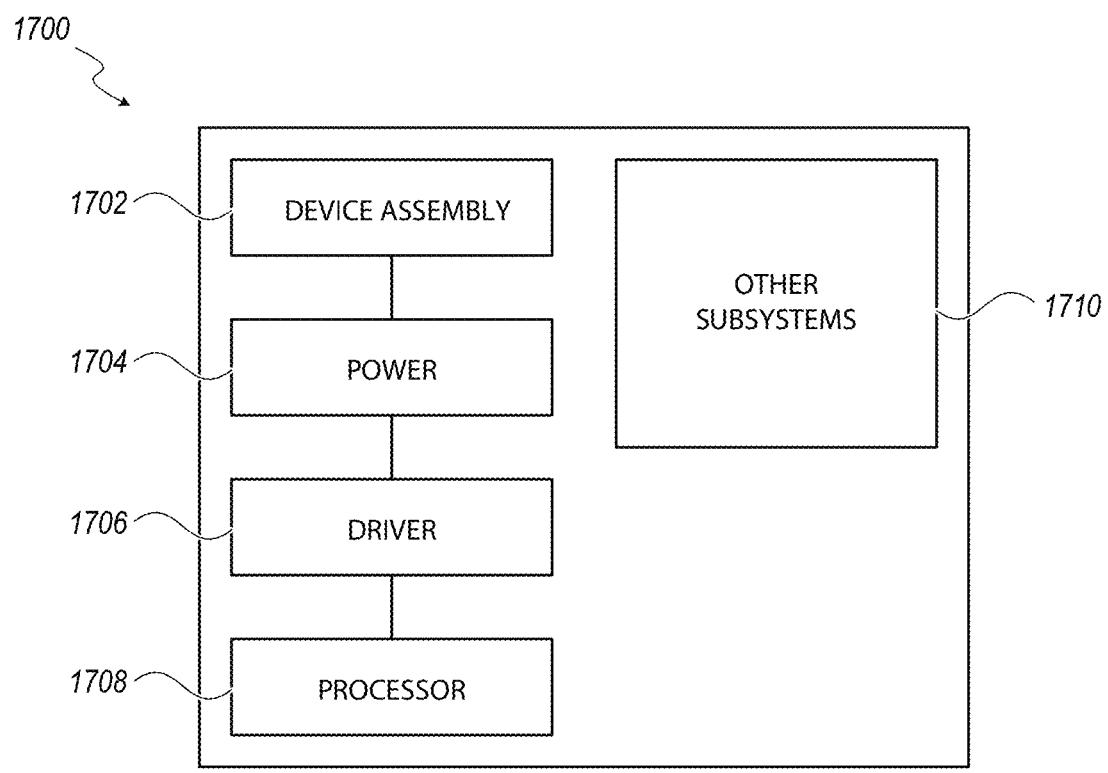
FIG. 17 is a schematic view showing a system that includes a semiconductor device assembly configured in accordance with an embodiment of the present technology.

Any one of the semiconductor devices and semiconductor device assemblies described above with reference to FIGS. 1-16 can be incorporated into any of a myriad of larger and/or more complex systems, a representative example of which is system 1700 shown schematically in FIG. 17. The system 1700 can include a semiconductor device assembly (e.g., or a discrete semiconductor device) 1702, a power source 1704, a driver 1706, a processor 1708, and/or other subsystems or components 1710. The semiconductor device assembly 1702 can include features generally similar to those of the semiconductor devices described above with reference to FIGS. 1-16. The resulting system 1700 can perform any of a wide variety of functions, such as memory storage, data processing, and/or other suitable functions. Accordingly, representative systems 1700 can include, without limitation, hand-held devices (e.g., mobile phones, tablets, digital readers, and digital audio players), computers, vehicles, appliances and other products. Components of the system 1700 may be housed in a single unit or distributed over multiple, interconnected units (e.g., through a communications network). The components of the system 1700 can also include remote devices and any of a wide variety of computer readable media.

Figure 18:
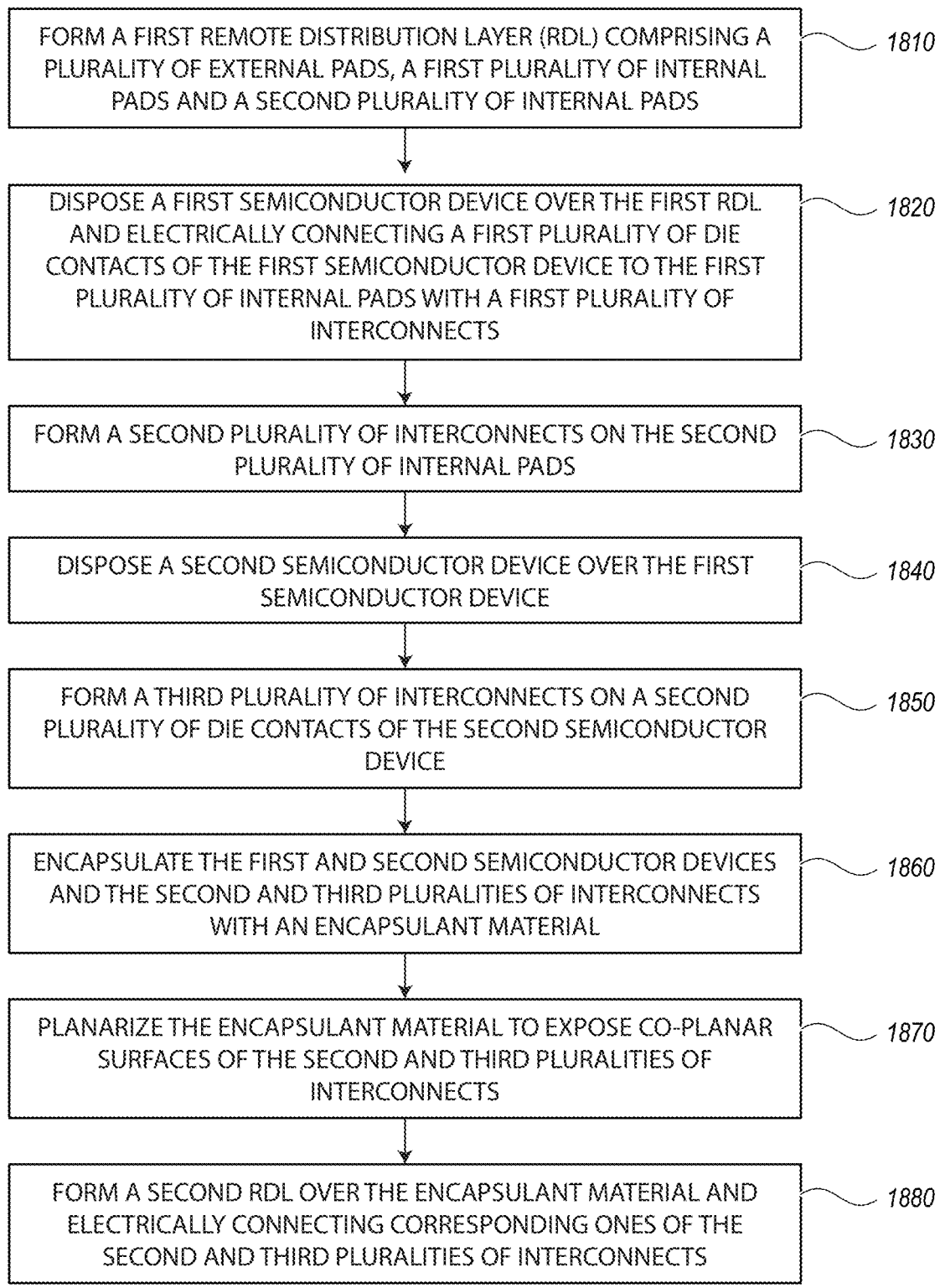
FIG. 18 is a flow chart illustrating a method of making a semiconductor device assembly in accordance with an embodiment of the present technology.

FIG. 18 is a flow chart illustrating a method of making a semiconductor device assembly. The method includes forming a first remote distribution layer (RDL) comprising a plurality of external pads, a first plurality of internal pads and a second plurality of internal pads (box 1810). The method further includes disposing a first semiconductor device over the first RDL and electrically connecting a first plurality of die contacts of the first semiconductor device to the first plurality of internal pads with a first plurality of interconnects (box 1820). The method further includes forming a second plurality of interconnects on the second plurality of internal pads (box 1830), disposing a second semiconductor device over the first semiconductor device (box 1840), and forming a third plurality of interconnects on a second plurality of die contacts of the second semiconductor device (box 1850). The method further includes encapsulating the first and second semiconductor devices and the second and third pluralities of interconnects with an encapsulant material (box 1860), planarizing the encapsulant material to expose co-planar surfaces of the second and third pluralities of interconnects (box 1870), and forming a second RDL over the encapsulant material and electrically connecting corresponding ones of the second and third pluralities of interconnects (box 1880).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a first remote distribution layer (RDL), the first RDL comprising a lower outermost planar surface of the semiconductor device assembly;
   a stack of first semiconductor dies directly coupled to an upper surface of the first RDL by a first plurality of interconnects;

a second RDL, the second RDL comprising an upper outermost planar surface of the semiconductor device assembly opposite the lower outermost planar surface;
a second semiconductor die directly coupled to a lower surface of the second RDL by a second plurality of interconnects;
an encapsulant material disposed between the first RDL and the second RDL and at least partially encapsulating the first and second semiconductor dies; and
a third plurality of interconnects extending fully between and directly coupling the upper surface of the first RDL and the lower surface of the second RDL.

2. The semiconductor device assembly of claim 1, wherein the stack of first semiconductor dies has a first back surface opposite the first plurality of interconnects, the second semiconductor die has a second back surface opposite the second plurality of interconnects, and the first and second back surfaces are coupled by an adhesive.

3. The semiconductor device assembly of claim 1, wherein the second semiconductor die is electrically coupled to the first RDL by the second plurality of interconnects, the second RDL, and the third plurality of interconnects.

4. The semiconductor device assembly of claim 1, wherein the upper outermost planar surface comprises a dielectric material with no openings.

5. The semiconductor device assembly of claim 1, wherein the lower outermost planar surface comprises a dielectric material with a plurality of openings in which a corresponding plurality of bond pads are disposed.

6. The semiconductor device assembly of claim 1, wherein each of the plurality of bond pads is electrically connected to an interconnect of the first plurality of interconnects, an interconnect of the third plurality of interconnects, or both.

7. The semiconductor device assembly of claim 1, wherein each of the second plurality of interconnects is electrically connected to a corresponding interconnect of the third plurality of interconnects.

8. The semiconductor device assembly of claim 1, further comprising a layer of underfill material between the second semiconductor device and the second RDL.

9. The semiconductor device assembly of claim 1, wherein a lower surface of each of the first plurality of interconnects is co-planar with a lower surface of each of the third plurality of interconnects.

10. A semiconductor device assembly, comprising:
a first remote distribution layer (RDL), the first RDL comprising a lower outermost planar surface of the semiconductor device assembly;
a first semiconductor die directly coupled to an upper surface of the first RDL by a first plurality of interconnects;
a second RDL, the second RDL comprising an upper outermost planar surface of the semiconductor device assembly opposite the lower outermost planar surface;
a stack of second semiconductor dies directly coupled to a lower surface of the second RDL by a second plurality of interconnects;
an encapsulant material disposed between the first RDL and the second RDL and at least partially encapsulating the first and second semiconductor dies; and
a third plurality of interconnects extending fully between and directly coupling the upper surface of the first RDL and the lower surface of the second RDL.

11. The semiconductor device assembly of claim 10, wherein the first semiconductor die has a first back surface opposite the first plurality of interconnects, the stack of second semiconductor dies has a second back surface opposite the second plurality of interconnects, and the first and second back surfaces are coupled by an adhesive.

12. The semiconductor device assembly of claim 10, wherein the stack of second semiconductor dies is electrically coupled to the first RDL by the second plurality of interconnects, the second RDL, and the third plurality of interconnects.

13. The semiconductor device assembly of claim 10, wherein the upper outermost planar surface comprises a dielectric material with no openings.

14. The semiconductor device assembly of claim 10, wherein the lower outermost planar surface comprises a dielectric material with a plurality of openings in which a corresponding plurality of bond pads are disposed.

15. The semiconductor device assembly of claim 10, wherein each of the plurality of bond pads is electrically connected to an interconnect of the first plurality of interconnects, an interconnect of the third plurality of interconnects, or both.

16. The semiconductor device assembly of claim 10, wherein each of the second plurality of interconnects is electrically connected to a corresponding interconnect of the third plurality of interconnects.

17. The semiconductor device assembly of claim 10, further comprising a layer of underfill material between the second semiconductor device and the second RDL.

18. The semiconductor device assembly of claim 10, wherein a lower surface of each of the first plurality of interconnects is co-planar with a lower surface of each of the third plurality of interconnects.

* * * * *